(12) United States Patent
Usuda et al.

(10) Patent No.: US 7,229,892 B2
(45) Date of Patent: Jun. 12, 2007

(54) SEMICONDUCTOR DEVICE AND METHOD OF MANUFACTURING THE SAME

(75) Inventors: Koji Usuda, Yokohama (JP); Shinichi Takagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 11/064,943

(22) Filed: Feb. 25, 2005

(65) Prior Publication Data
US 2005/0191797 A1   Sep. 1, 2005

(30) Foreign Application Priority Data
Feb. 27, 2004   (JP) .............................. 2004-053394

(51) Int. Cl.
*H01L 21/762* (2006.01)
*H01L 21/8232* (2006.01)

(52) U.S. Cl. ............... 438/405; 438/406; 438/455; 438/503; 257/E29.193; 257/E29.122; 257/E21.567; 257/E21.569

(58) Field of Classification Search ............... 438/405, 438/406, 455, 503, FOR. 222; 257/E29.193, 257/E21.122, E21.567, E21.569; 148/DIG. 12
See application file for complete search history.

(56) References Cited

U.S. PATENT DOCUMENTS

| | | | | |
|---|---|---|---|---|
| 4,948,748 A | * | 8/1990 | Kitahara et al. | 438/405 |
| 4,985,745 A | * | 1/1991 | Kitahara et al. | 257/506 |
| 5,079,183 A | * | 1/1992 | Maeda et al. | 438/219 |
| 5,399,507 A | * | 3/1995 | Sun | 438/152 |
| 5,476,809 A | * | 12/1995 | Kobayashi | 438/405 |
| 5,728,623 A | * | 3/1998 | Mori | 438/455 |
| 5,740,099 A | * | 4/1998 | Tanigawa | 365/51 |
| 6,690,043 B1 | | 2/2004 | Usuda et al. | |
| 6,767,802 B1 | * | 7/2004 | Maa et al. | 438/406 |

(Continued)

FOREIGN PATENT DOCUMENTS

| | | |
|---|---|---|
| JP | 4-372166 | 12/1992 |
| JP | 9-219524 | 8/1997 |

(Continued)

OTHER PUBLICATIONS

J. Welser et al., "Strain Dependence of the Performance Enhancement in Strained-Si n-MOSFETs", IEDM 94, pp. 373-376, (1994).

(Continued)

*Primary Examiner*—George Fourson
(74) *Attorney, Agent, or Firm*—Finnegan, Henderson, Farabow, Garrett & Dunner, L.L.P.

(57) ABSTRACT

A method of manufacturing a semiconductor device, includes preparing a semiconductor substrate, bonding a first semiconductor layer onto a part of the semiconductor substrate with a first insulating layer interposed therebetween, forming a second insulating layer on a side of the first semiconductor layer, epitaxially growing a second semiconductor layer in a region on the semiconductor substrate other than a region formed with the first insulating layer, forming a first semiconductor element in the first semiconductor layer on the first insulating layer, and forming a second semiconductor element in the second semiconductor layer on the second insulating layer.

9 Claims, 2 Drawing Sheets

U.S. PATENT DOCUMENTS

| | | | |
|---|---|---|---|
| 2001/0008292 A1* | 7/2001 | Leobandung et al. | 257/347 |
| 2002/0127816 A1* | 9/2002 | Cha et al. | 438/404 |
| 2003/0104658 A1* | 6/2003 | Furukawa et al. | 438/151 |
| 2005/0070070 A1* | 3/2005 | Rim | 438/406 |

FOREIGN PATENT DOCUMENTS

| | | |
|---|---|---|
| JP | 11-204541 | 7/1999 |
| JP | 11-340337 | 12/1999 |
| JP | 2000-277715 | 10/2000 |
| JP | 2001-44425 | 2/2001 |
| JP | 2002-270826 | 9/2002 |
| JP | 2003-318110 | 11/2003 |

OTHER PUBLICATIONS

T. Mizuno et al., "High Performance CMOS Operation of Strained-SOI MOSFETs using Thin Film SIGe-on-Insulator Substrate," 2002 Symposium on VLSI Technology Digest of Technical Papers (2002).

Copy of Notification of Reasons for Rejection issued by the Japanese Patent Office dated Mar. 14, 2006, and English translation thereof.

* cited by examiner

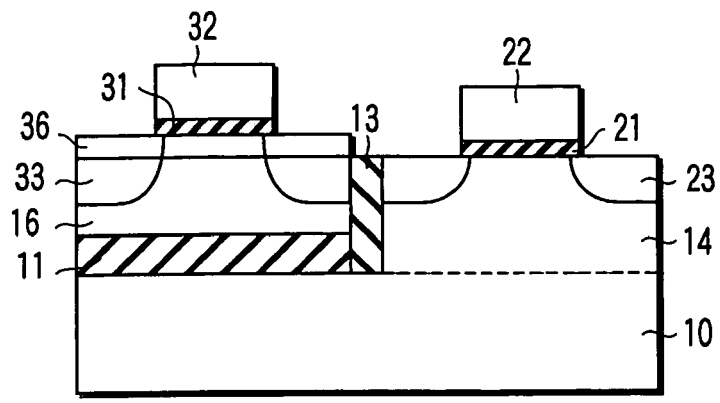
F I G. 5
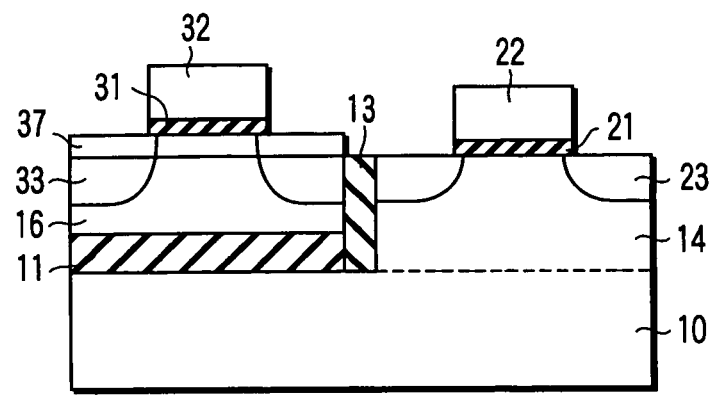
F I G. 6
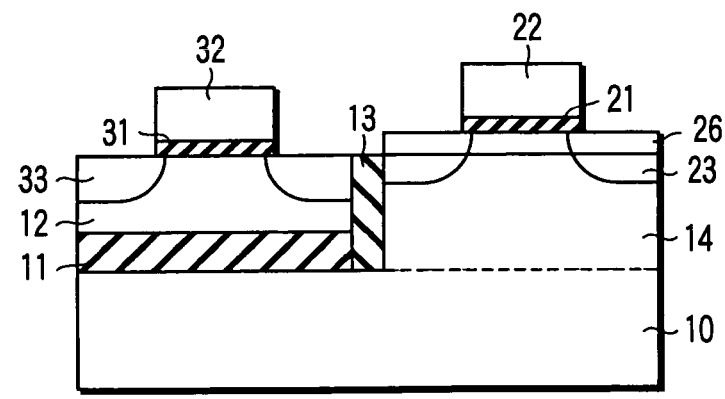
F I G. 7
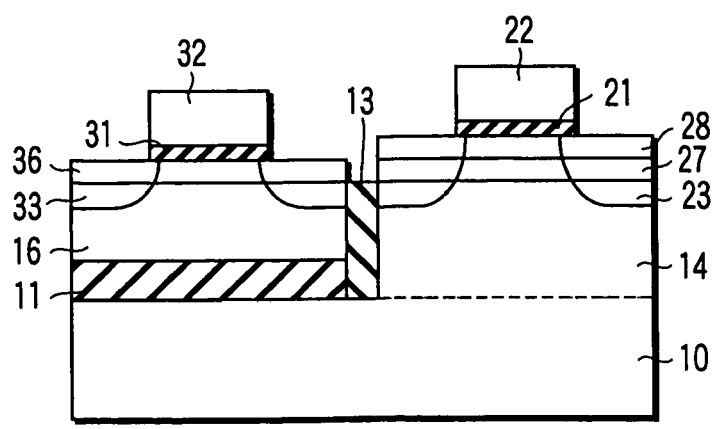
F I G. 8

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-053394, filed Feb. 27, 2004, the entire contents of which are incorporated herein by reference.

BACKGROUND OF THE INVENTION

1. Field of the Invention

The present invention relates to a semiconductor device having a structure in which part of a semiconductor substrate is isolated via an insulating layer. Moreover, the present invention relates to a method of manufacturing the semiconductor device.

2. Description of the Related Art

The performance of semiconductor elements used in Si-LSIs, in particular, MOSFETs has been enhanced year by year with advances in LSI technology. However, a limit to the lithography technique is indicated in light of recent process techniques, while saturation of mobility is indicated in light of element physics. For this reason, it is very difficult to achieve high performance of the semiconductor elements.

The following technique has attracted special interest as a method of improving electron mobility, which is one of the high-performance indices of an Si-MOSFET. According to the technique, strain is applied to an active layer for forming elements. The strain is applied to the active layer, and thereby, the band structure changes and carriers contained in a channel are prevented from scattering. Thus, it is expected to enhance the mobility. More specifically, a compound crystal layer consisting of a material having a lattice constant larger than silicon (Si) is formed on an Si substrate. For example, a strain-relaxed SiGe compound crystal layer (hereinafter, referred simply to as SiGe layer) having 20% Ge concentration is formed on the Si substrate. When an Si layer is formed on the SiGe layer, a strained Si layer to which strain is applied is formed according to the difference in the lattice constant. The following report has been made (e.g., see J. Welser, J. L. Hoyt, S. Takagi and J. F. Gibbons, IEDM 94-373). According to the report, when the strained Si layer is used as a channel of the semiconductor device, it is possible to obtain electron mobility of about 1.76 times as much as the case where a non strained Si channel is used.

In order to form the foregoing strained Si channel on an silicon-on-insulator (SOI) structure, the present inventors realized a device structure using the following method. According to the method, the strained Si layer is formed on the strain-relaxed SiGe layer on a buried oxide layer (e.g., see T. Mizuno et al., 11-3, 2002 Symposia on VLSI Tech.). A transistor having such a structure is excellent in short channel effect (SCE) and reduction of parasitic capacitance; therefore, it serves to realize high-performance elements.

However, if the scale-down further advances, for example, a 35 nm node element will be produced in future. In this case, the thickness of the strained Si channel is experimentally ⅓ to ¼ of the gate length, that is, several nanometers, and thus, becomes extremely thin. For this reason, there is a possibility that the crystal layer deteriorates. For example, if the strained Si layer is given as one example, the lattice spacing between a front-end layer and a back-end strain-applied layer is percent (%) order to apply strain. As a result, crystal defect resulting from strain occurs in crystal.

If the strained Si channel contacts with a semiconductor material different from Si, for example, front-end SiGe layer, there is a possibility that Ge diffuses from the SiGe layer to the strained Si layer. This is a factor of causing a strain change, carrier transportation change or increase of interface state in the element producing process and in the device operation. For this reason, there is a possibility that element characteristics are degraded.

Meanwhile, one-chip technique development, typical of DRAM embedded process, is important as a technique required for manufacturing logic operation elements applied to a next generation computer system. The foregoing embedded process has attracted special interest for the following reason. Because, the embedded process is a technique of forming a logic circuit and a memory elements such as DRAM on the same substrate, and reducing power consumption and cost while maintaining high speed operation. In this case, high performance elements having high processing speed are required as the logic circuit. On the other hand, high-quality semiconductor devices must be manufactured in view of yield to form the memory elements.

In the technique of integrating high-performance logic element and high-quality memory element on the same substrate, it is necessary to break down a limit of high-performance logic element resulting from a limit of scale-down. In addition, there is a limit in the method of integrating high-quality memory elements on the single substrate like the conventional technique. Moreover, the following various problems are mixed; as a result, there is a problem that it is more and more difficult to achieve integration between generations. The various problems are as follows.

Reduction of element performance enhancement effect resulting from the advance of scale-down Cost Increase Increase of the number of manufacturing processes Difficulty of circuit design by drive force reduction resulting from high integration Consequently, it is necessary to realize the technique of integrating logic elements requiring higher performance and memory elements requiring higher quality and higher integration on the same substrate. It has been desired to realize a semiconductor device which is adaptable to reduction of cost and number of processes, and to realize a method of manufacturing the semiconductor device.

BRIEF SUMMARY OF THE INVENTION

According to a first aspect of the invention, there is provided a method of manufacturing a semiconductor device, which comprises:

preparing a semiconductor substrate;

bonding a first semiconductor layer onto a part of the semiconductor substrate with a first insulating layer interposed therebetween;

forming a second insulating layer on a side of the first semiconductor layer;

epitaxially growing a second semiconductor layer in a region on the semiconductor substrate other than a region formed with the first insulating layer; and forming a first semiconductor element in the first semiconductor layer on the first insulating layer, and forming a second semiconductor element in the second semiconductor layer on the second insulating layer.

According to a second aspect of the invention, there is provided a semiconductor device, which comprises:

a semiconductor substrate;

a first insulating layer selectively formed on part of the semiconductor substrate;

a first semiconductor layer bonded on the first insulating layer, and having crystal characteristic different from the semiconductor substrate;

a first semiconductor layer formed on the semiconductor substrate other than a region where the first semiconductor layer is bonded, and having the same crystal characteristic as the semiconductor substrate;

a second insulating layer formed between the side of the first semiconductor layer and the second semiconductor layer, and electrically isolating the first semiconductor layer from the second semiconductor layer;

a first semiconductor element formed on the first semiconductor layer; and a second semiconductor element formed on the second semiconductor layer.

BRIEF DESCRIPTION OF THE SEVERAL VIEWS OF THE DRAWING

FIG. 5 is a cross-sectional view showing the element structure of a semiconductor device according to a third embodiment of the present invention;

FIG. 6 is a cross-sectional view showing another element structure of the semiconductor device according to the third embodiment;

FIG. 7 is a cross-sectional view showing the element structure of a semiconductor device according to a fourth embodiment of the present invention; and FIG. 8 is a cross-sectional view showing the element structure of a semiconductor device according to a fifth embodiment of the present invention.

DETAILED DESCRIPTION OF THE INVENTION

According to embodiments of the present invention described below, a first semiconductor layer is bonded to part of a semiconductor substrate via a first insulating film. A second semiconductor layer is grown to the same height as the first semiconductor layer in a region on the semiconductor substrate other than the bonded first semiconductor layer. In this way, part of the semiconductor substrate is isolated via the insulating layer; and a so-called silicon-on-insulator (SOI) structure is realized. Physical characteristics such as surface orientation, composition and lattice strain are changed between the first and second semiconductor layers. In this way, there is formed a single substrate provided with semiconductor regions having different characteristic.

Thus, the following matter is realized in the technique of integrating high performance logic element and high quality memory element on the same substrate. More specifically, in the foregoing technique, the logic element is formed on the SOI part (first semiconductor layer side) while the memory element is formed on the substrate part (second semiconductor layer side). In this way, it is possible to integrate high performance logic element and high quality and high integration memory element on the same substrate. Moreover, this serves to reduce the cost and the number of processes.

Embodiments of the present invention will be described below with reference to the accompanying drawings.

(First Embodiment)

Figure 1:
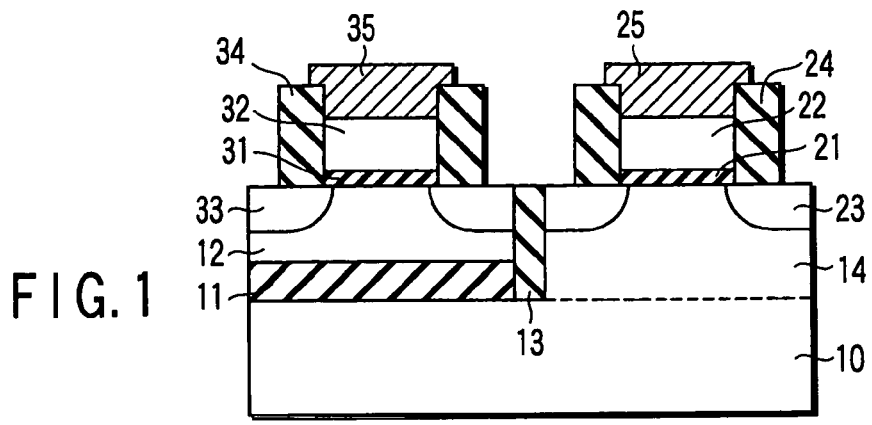
FIG. 1 is a cross-sectional view showing the element structure of a semiconductor device according to a first embodiment of the present invention.

FIG. 1 is a cross-sectional view showing the element structure of a semiconductor device according to a first embodiment of the present invention. A strained Si layer (first semiconductor layer) 12 having surface orientation (001) is bonded. In this case, the strained Si layer 12 is bonded onto part (left-side region in FIG. 1) of a single crystal Si substrate 10 (semiconductor substrate) via an insulating layer (first insulating film) 11 such as $SiO_2$. In this way, the left-side region in FIG. 1 is formed having a structure close to the SOI structure. The side of the strained Si layer 12 is formed with an insulating layer (second insulating film) 13 such as $SiO_2$. An Si layer (second semiconductor layer) 14 as a re-growth layer is grown and formed on a region (right-side region in FIG. 1) of the Si substrate 10 where no strained Si layer exists. In FIG. 1, the insulating layer 13 is interposed between the strained Si layer 12 and the re-growth layer 14. Actually, the insulating layer 13 is formed to surround the entire periphery of the strained Si layer 12.

The right-side region in FIG. 1 is formed with a gate electrode layer 22 via a gate insulating layer 21, and further, a source/drain layer 23 is formed, and thereby, a MOSFET is formed. In FIG. 1, reference numerals 24 and 34 denote interlayer insulating film, 25 and 35 denote interconnect electrodes. The depth of the source/drain regions depends on the applied process technique and is in general under 1000 nm, typically 500 nm and 100 nm. In the high-performance devices in the next generation, the depth will be under 10 nm and may be as thick as the channel region.

According to the first embodiment, the following features are given. More specifically, partial SOI structure in which the strained Si layer is bonded onto part of the Si substrate 10 via the insulating layer 11 is employed. In the conventional partial SOI structure, the insulating layer is formed in parallel to the substrate surface. Conversely, in the first embodiment, the end portion of the insulating layer is formed toward the substrate surface. In other words, only insulating layer 11 is formed in the conventional structure; however, according to the first embodiment, the insulating layer 13 is newly formed.

Figure 2:
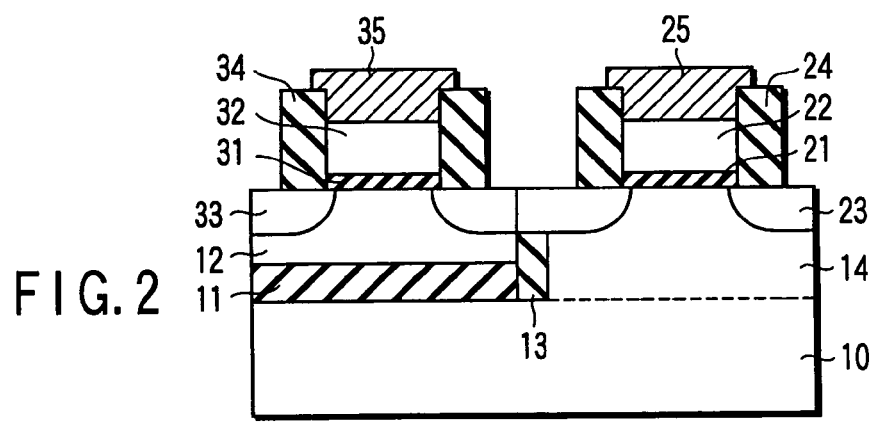
FIG. 2 is a cross-sectional view showing another element structure of the semiconductor device according to the first embodiment.

FIG. 1 shows a state that the insulating layer 13 fully connects the insulating layer 11 and the substrate surface. In this case, part of the Si substrate 10 has an isolation layer structure, which is fully isolated from the substrate via the insulating layers 11 and 13. On the other hand, as shown in FIG. 2, the insulating layer 13 may be formed so that it extends from the end portion of the insulating layer 11 toward the substrate surface, and does not reach there. In any case, merits of the conventional SOI element, that is, interference between two elements shown in FIG. 2 is reduced, and advantages of eliminating latch-up and parasitic transistor effect are obtained. In addition, if the element is used as a single element, parasitic capacitance and short channel effect (SCE) are reduced. Either of the structure shown in FIG. 1 or FIG. 2 is arbitrarily determined in accordance with circuit design.

Figures 3A, 3B:
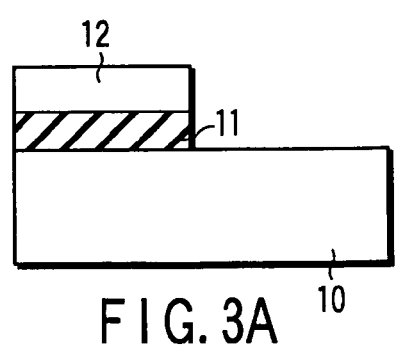
FIGS. 3A and 3B are cross-sectional views to explain the method of manufacturing an element forming substrate used for the first embodiment.

The method of forming an element forming substrate of the first embodiment will be described below with reference to FIGS. 3A and 3B. In this case, the strained (001) Si layer 12 is given as one example of the method. As illustrated in FIGS. 3A and 3B, an SOI substrate is used to realize the foregoing strained (001) Si layer 12. According to the first embodiment, the Si substrate 10 and the strained (001) Si layer 12 are directly bonded together via the insulating layer 11, as depicted in FIG. 3A.

More specifically, the strained (001) Si layer 12 on which the insulating layer 11 is formed is directly bonded onto the Si substrate 10. In this case, since the insulating layer 11 is interposed between the Si substrate 10 and the strained (001) Si layer 12, a desired layer bonding is realized without succeeding lattice information of the front-end substrate 10. The strained (001) Si layer 12 thus bonded is removed using etching together with the insulating layer 11 under there, leaving portions for forming a semiconductor device such as a transistor in place. Note that the method bonding the Si substrate 10 and the Si layer 12 is not limited to the above-described one. It suffices that the Si substrate 10 and the Si layer 12 are bonded together, after forming the insulating layer 11 on at least one of the Si substrate 10 and the Si layer 12. The insulating layer 11 may be prepared on at least one of the Si substrate 10 and the Si layer 12 beforehand. A $SiO_2$ film is deposited on the entire surface using the Si layer 12. Thereafter, the $SiO_2$ film on the Si substrate is removed using reactive ion etching (RIE) so that the second insulating layer 13 is left on the sides of the strained Si layer 12 and the first insulating layer 11. The layer thickness of the second insulating layer in the direction parallel to the substrate surface is 1 nm to 5 µm, typically, 10 nm to 300 nm. For the application to high breakdown voltage elements, a typical value of the layer thickness is 500 nm to 2 µm. In the first embodiment, the second insulating layer 13 is formed smaller than that in the case where an element isolation region is formed using field oxide (FOX). Therefore, high density packing of semiconductor elements can be achieved.

Finally, as shown in FIG. 3B, a re-growth layer 14 is formed on the removed part to form a desired substrate. Incidentally, the re-growth layer 14 is formed via epitaxial growth; in this case, it is desirable that the growth surface is flush with the Si layer. The growth conditions are as follows. The thickness of the re-growth layer 14 is typically about 50 to 5000 nm. Thus, it is sufficient so long as crystal growth equivalent to the foregoing thickness is made. The crystal growth rate is different depending on substrate surface temperature, gas partial pressure and gas species. If the Si layer is grown using CVD, $SiH_4$ (silane), $Si_2H_6$ (disilane), $Si_3H_8$ (trisilane) and $SiHsCl_2$ (dichlorsilane) are used. In this case, if the substrate temperature is kept at 650° C., crystal growth of about 10 nm per minute is expected at pressure of 5 Torr. If a desired thickness is 300 nm, about 30 minutes are required as the crystal growth time. The growth rate is sensitive to conditions such as gas flow and the presence of rotation of substrate, and largely changes depending on those.

The gas pressure is usable from high pressure to low pressure of $10^{-6}$ Torr. Growth is made at a temperature 400 to 1000° C. depending on the gas species. In order to grow a SiGe layer, a combination of GeH4 gas (germane gas) and silane gas is used. In general, there is a case where the growth rate is as much as several times faster than the growth of an Si single layer. Besides, there is the case where growth using molecular beam epiytaxy (MBE), plasma growth and liquid phase growth may be employed using a mask with respect to regions other than desired region.

In this case, the re-growth interface is inherently the surface of the substrate; therefore, epitaxial growth is possible. Thus, the re-growth layer 14 epitaxially grown directly on the substrate 10 has good quality crystal having little crystal defects. Therefore, the re-growth layer 14 is suitable for forming elements such as a DRAM requiring reliability. On the other hand, the strained (001) Si layer 12 is applicable for forming a MOSFET having high mobility higher than usual. Therefore, the strained (001) Si layer 12 is suitable for forming semiconductor devices requiring high performance transistor such as logic elements.

In order to manufacture a MOS transistor on the strained Si layer 12 and the re-growth layer 14, the following process is carried out. More specifically, an oxide film such as $SiO_2$ is formed in the same manner as the normal MOSFET manufacturing process. A polycrystalline silicon film is formed on the oxide film, and thereafter, patterned into a gate electrode shape. Then, ion implantation is carried out to form a source/drain at least in the strained Si layer 12 and the re-growth layer 14 using the gate electrode as a mask, and thereafter, an interlayer insulating film is deposited. The interlayer insulating film is formed with a contact hole for contacting with the gate electrode and the source/drain, and thereafter, interconnect layers such as Al are formed. In FIGS. 1 and 2, gate insulating films 21, 31, gate electrodes 22, 32, interlayer insulating films 24, 34, interconnect electrodes 25 and 35 are formed with the same layer, respectively. Thus, a MOS transistor is simultaneously manufactured on the strained Si layer 12 and the re-growth layer 14.

According to the first embodiment, the strained Si layer 12 having the partial SOI structure is formed on the Si substrate 10. Further, semiconductor elements adaptable to the strained Si layer 12 and the re-growth layer 14, respectively, are formed. Therefore, logic elements requiring high performance and memory elements requiring high quality and integration are formed on the substrate 10. Thus, this contributes to reduction of cost and the number of processes.

(Second Embodiment)

Figure 4:
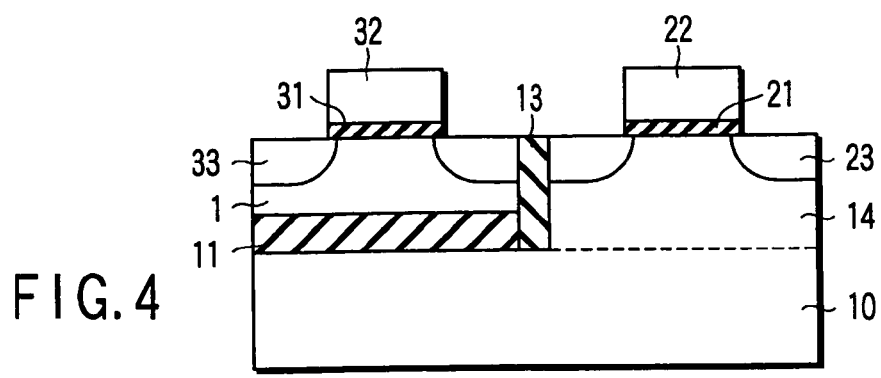
FIG. 4 is a cross-sectional view showing the element structure of a semiconductor device according to a second embodiment of the present invention.

FIG. 4 is a cross-sectional view showing the element structure of a semiconductor device according to a second embodiment of the present invention. Incidentally, the same reference numerals are used to designate the same portions as FIG. 1, and the details are omitted.

According to the second embodiment, in the left-side element region of FIG. 4, a strained (110) Si layer 15 is formed on a region surrounded by insulating layers 11 and 13. The second embodiment differs from the first embodiment in that the strained Si layer 15 has crystal orientation different from the Si substrate 10 as a partial SOI structure.

When the structure described above is employed, a desired crystal orientation is selectable for a channel of a MOSFET. Moreover, it is possible to realize a semiconductor device, which effectively uses crystal orientation dependency of mobility. In addition to the crystal orientation, the inclination of crystallographic axis is selectable with respect to the Si substrate 10. In the strained layer described in the first embodiment, it is possible to form a layer wherein an arbitrary crystal orientation is selected.

(Third Embodiment)

FIG. 5 is a cross-sectional view showing the element structure of a semiconductor device according to a third embodiment of the present invention. Incidentally, the same reference numerals are used to designate the same portions as FIG. 1, and the details are omitted.

According to the third embodiment, in the left-side element region of FIG. 5, a strain-relaxed SiGe layer 16 is formed on a region surrounded by insulating layers 11 and 13. The strain-relaxed SiGe layer 16 is prepared according to the bonding process described in the first embodiment. An added strained Si layer 36 is further formed on the strain-relaxed SiGe layer 16.

In this case, the strained Si layer 36 is formed with a source/drain region, and then, functions as a channel. The strained Si layer 36 has a lattice constant range different from the lattice constant d of the front-end surface (i.e., surface of SiGe layer 16) for growing the layer 36, that is, a range of $|\Delta d| < \pm 40\%$, more preferably, a range of $|\Delta d| < \pm 2\%$.

A strained semiconductor layer formed on the strain-relaxed SiGe layer 16 is not necessarily limited to Si. In this case, arbitrary layers may be formed so long as they have crystal epitaxially growing on the SiGe layer 16. FIG. 6 shows an embodiment in which a strained Ge layer 37 is formed in place of the strained Si layer 36.

According to the third embodiment, both of the composition and strain are controllable; therefore, optimization is achieved in accordance with the purpose of semiconductor devices.

(Fourth Embodiment)

FIG. 7 is a cross-sectional view showing the element structure of a semiconductor device according to a fourth embodiment of the present invention. Incidentally, the same reference numerals are used to designate the same portions as FIG. 1, and the details are omitted.

According to the fourth embodiment, a strained SiGe layer 26 is additionally formed on the re-growth layer directly growing in the right-side element region of FIG. 7, like the third embodiment. In this case, the strained SiGe layer 26 is formed with a source/drain region, and then, functions as a channel. The strained SiGe layer 26 has a lattice constant range different from the lattice constant d of the front-end surface for growing the layer 26, that is, a range of $|\Delta d| < \pm 40\%$, more preferably, a range of $|\Delta d| < \pm 2\%$.

(Fifth Embodiment)

FIG. 8 is a cross-sectional view showing the element structure of a semiconductor device according to a fifth embodiment of the present invention. Incidentally, the same reference numerals are used to designate the same portions as FIG. 1, and the details are omitted.

According to the fifth embodiment, in the left-side element region of FIG. 8, a lattice-relaxed SiGe layer 16 is formed on a region surrounded by insulating layers 11 and 13, like the third embodiment. In the right-side element region, a lattice-relaxed SiGe layer 27 is formed on the re-growth layer 14, and further, a strained Si layer 28 is formed thereon.

When the structure described above is given, the element forming substrate is formed to have strained Si layers in both right and left sides. Therefore, it is possible to realize a semiconductor device having higher performance.

(Modification)

The present invention is not limited to the foregoing embodiments. In the preceding embodiments, the Si substrate is used as the semiconductor substrate; in this case, other semiconductor materials may be used without being limited to the Si substrate. That is, a single layer containing at least one of Si, Ge, Ga, As, P, B, N, Sb, C, W, Ti, Ni, Ce, Sr, Pr, In, Al, N and O or a laminated layer formed of several layers may be used as the semiconductor substrate. More specifically, SiGe, SiGeC, SiC, InGaAs, AlGaAs, GaN, GaAs, InAs and SiN may be used. Moreover, a single layer containing at least one of Si, Ge, Ga, As, P, B, N, Sb, C, W, Ti, Ni, Ce, Sr, Pr, In, Al, N and O or a laminated layer formed of several layers may be used as the added semiconductor layer.

The first and second insulating layers are not necessarily limited to $SiO_2$. In this case, another insulating oxide film, insulating nitride film, crystal layer having insulation, porous layer and amorphous layer may be used. MBE, sputtering, CVD, heat diffusion, coating and liquid phase stacking may be used as a method of forming the foregoing layers.

The thickness of the strain-relaxed SiGe layer and the strained Si layer formed as the re-growth layer is properly modified in accordance with specifications by changing crystal growth conditions. The memory element is not limited to a DRAM; in this case, the present invention is applicable to an SRAM, flash memory, rewritable memory, e.g., EEPROM, MRAM, FRAM, OUM, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

preparing a semiconductor substrate;

bonding a first semiconductor layer onto a part of the semiconductor substrate with a first insulating layer interposed therebetween;

forming a second insulating layer on a side of the first semiconductor layer;

epitaxially growing a second semiconductor layer in a region on the semiconductor substrate other than a region formed with the first insulating layer; and forming a first semiconductor element in the first semiconductor layer on the first insulating layer, and forming a second semiconductor element in the second semiconductor layer on the second insulating layers, wherein said bonding the first semiconductor layer onto the part of the first insulating layer includes bonding the first semiconductor layer so as to have strain.

2. The method according to claim 1, wherein each of the first insulating layer and the second insulating layer includes a layer having an insulation property using one process selected from the group consisting of MBE, sputtering, CVD, heat diffusion, coating and liquid phase stacking processes.

3. The method according to claim 2, wherein the layer having the insulation property is one selected from the group consisting of crystal layer, porous layer and amorphous layer.

4. The method according to claim 1, wherein said forming the second insulating layer includes forming the second insulating layer to have a thickness of 10 to 300 nm between the first semiconductor layer and the second semiconductor layer.

5. The method according to claim 1, wherein the semiconductor substrate contains at least one element selected from the group consisting of Si, Ge, Ga, As, P, B, N, Sb, C, W, Ti, Ni, Ce, Sr, Pr, In, Al and O.

6. The method according to claim 1, wherein said forming the first semiconductor element and the second semiconductor element includes forming a logic element as the first semiconductor element while forming a memory element as the second semiconductor element.

7. The method according to claim 1, wherein at least one-layer added semiconductor layer is formed on at least one of the first semiconductor layer and the second semiconductor layer.

8. The method according to claim 7, wherein said forming the added semiconductor layer includes forming the added semiconductor layer so as to have strain.

9. The method according to claim 7, wherein said forming the first semiconductor element and the second semiconductor element includes forming the first semiconductor element and the second semiconductor element such that at least part of the first semiconductor element or the second semiconductor element is formed in the added semiconductor layer.

* * * * *

UNITED STATES PATENT AND TRADEMARK OFFICE
CERTIFICATE OF CORRECTION

PATENT NO. : 7,229,892 B2  Page 1 of 1
APPLICATION NO. : 11/064943
DATED : June 12, 2007
INVENTOR(S) : Usuda et al.

It is certified that error appears in the above-identified patent and that said Letters Patent is hereby corrected as shown below:

Claim 1, column 8, line 42, change "layers," to --layer,--.

Signed and Sealed this

Seventh Day of August, 2007

JON W. DUDAS
*Director of the United States Patent and Trademark Office*